US011942395B2

(12) United States Patent
Beaupré-Laflamme et al.

(10) Patent No.: US 11,942,395 B2
(45) Date of Patent: Mar. 26, 2024

(54) APPARATUS FOR PROTECTING A STACK OF ELECTRONIC COMPONENTS AND METHOD OF THE SAME

(71) Applicant: Ciena Corporation, Hanover, MD (US)

(72) Inventors: Raphael Beaupré-Laflamme, Quebec (CA); Simon Savard, Quebec (CA); Lam Nguyen, Québec (CA)

(73) Assignee: Ciena Corporation, Hanover, MD (US)

( * ) Notice: Subject to any disclaimer, the term of this patent is extended or adjusted under 35 U.S.C. 154(b) by 121 days.

(21) Appl. No.: 17/535,138

(22) Filed: Nov. 24, 2021

(65) Prior Publication Data

US 2023/0163046 A1    May 25, 2023

(51) Int. Cl.
*H01L 23/42*    (2006.01)
*H01L 23/40*    (2006.01)
*H01L 25/065*    (2023.01)

(52) U.S. Cl.
CPC ...... *H01L 23/4012* (2013.01); *H01L 25/0657* (2013.01); *H01L 2023/4031* (2013.01)

(58) Field of Classification Search
CPC ... H05K 1/11; H05K 1/14; H05K 5/00; H05K 5/04; H05K 5/06; H05K 7/10; H05K 7/12; H01R 12/16; H01L 23/4012; H01L 23/42
USPC ................ 361/737, 752–759, 770–795, 803; 257/659–690, 730; 174/350
See application file for complete search history.

(56) References Cited

U.S. PATENT DOCUMENTS

| 6,218,730 | B1 * | 4/2001 | Toy ......................... H01L 23/42 257/713 |
| 7,754,983 | B2 * | 7/2010 | Sunohara ................ H01L 23/04 257/704 |
| 8,319,335 | B2 * | 11/2012 | Bayerer .............. H01L 23/4952 257/565 |
| 8,971,056 | B2 * | 3/2015 | Feldle ..................... G01S 7/032 361/784 |
| 10,440,811 | B2 | 10/2019 | Gareau et al. |
| 2003/0062533 | A1 * | 4/2003 | Yee ..................... H10K 50/8426 257/99 |
| 2011/0228506 | A1 * | 9/2011 | Chen ....................... H01L 22/32 361/810 |
| 2016/0021756 | A1 * | 1/2016 | Lee ....................... H05K 3/4015 29/841 |
| 2016/0126426 | A1 * | 5/2016 | Kim ....................... H01L 33/58 257/98 |
| 2016/0181479 | A1 * | 6/2016 | Kim ..................... H01L 33/486 257/98 |
| 2016/0380168 | A1 * | 12/2016 | Han ........................ H01L 33/58 174/255 |

* cited by examiner

*Primary Examiner* — Tuan T Dinh
(74) *Attorney, Agent, or Firm* — Young Basile Hanlon & MacFarlane, P.C.

(57) ABSTRACT

An apparatus including first and second substrates. The first and second substrates each include a base and at least one peripheral wall extending from the base. One of the at least one peripheral walls of the first or second substrates includes at least one well, and the other of the at least one peripheral walls of the first or the seconds substrate that does not include a well is mechanically anchored to the well. The apparatus includes a stack having a first and second end, and the stack is disposed on the base of the first and/or the second substrates at the first and/or second ends. The stack includes at least one element configured to generate energy. A method of assembling the apparatus by contacting the substrates.

22 Claims, 5 Drawing Sheets

APPARATUS FOR PROTECTING A STACK OF ELECTRONIC COMPONENTS AND METHOD OF THE SAME

TECHNICAL FIELD

This disclosure relates to an apparatus that is configured to improve thermal properties of and protect a stack of electronic components.

BACKGROUND

In modern electronic devices, the components within the electronic devices continue to get smaller and are housed within smaller bodies. These components produce significant energy in the form of heat, and new techniques are needed to manage these energy loads within the smaller electronic devices. As the electronic devices are very small, minor imperfections can lead to reduced efficacy for internal components because the internal components are not precisely aligned. Even very small alignment issues can cause issues with components that regulate the energy, such as conductors, heatsinks and grounds because well-aligned physical connections help these components to regulate energy.

SUMMARY

In some aspects, in general, an apparatus can be configured with a point of contact between an energy producing component and a conductor that has high surface area. An apparatus can be configured with a connection between a heat producing component and a conductor that is configurable so that the alignment between the components is easily adjustable before finishing assembly. An apparatus can be configured to thermally regulate a stack of electronics in a highly efficient manner. Methods can be used to adjust alignment of two components that are in contact with another component that produces energy at high levels.

In one aspect, in general, the present disclosure provides an apparatus that includes first and second substrates, and each of the first and second substrates include a base and at least one peripheral wall extending from the base. One of the at least one peripheral walls of the first or second substrates includes at least one well, and the other of the at least one peripheral walls of the first or the seconds substrate that does not include a well is mechanically anchored to the well. The apparatus includes a stack having a first and second end, and the stack is disposed on the base of the first and/or the second substrates at the first and/or second ends. The stack includes at least one element configured to generate energy.

In another aspect, in general, the present disclosure provides a method that includes contacting a stack with a base of a first or a second substrate. One of the first or second substrates includes at least one peripheral wall that extends from the base and that defines at least one well. The method includes disposing a predetermined amount of adhesive within the at least one well and contacting at least one peripheral wall of the other of the first or second substrates that does not include the at least one well and the adhesive disposed within the at least one well. The method includes curing the adhesive so that the first and second substrates are mechanically anchored to each other by the adhesive.

In another aspect, in general, the present disclosure provides an apparatus that includes first and second substrates. The first and second substrates each include a base that supports the stack and at least one peripheral wall extending from the base. One of the first or second substrates include a well-defined within the at least one peripheral wall. The well includes a first portion that has a bottom surface that intersects a first plane parallel to the base, and a second portion that has a bottom surface that intersects a second plane parallel to the base, where the first plane is closer to the base than the second plane. The first and second substrates are mechanically anchored at the well.

Aspects can include one or more of the following features. The first and second substrates each may include first and second surfaces, and the first substrate may be in contact with the stack at the first surface. The second substrate includes a protrusion that extends between the second surface of the second substrate and the stack. The first surface of the second substrate may in contact with a component, and the component may receive energy from one or more other components. The second substrate may be a conductor that facilitates the transfer of energy between the stack and the component. The first substrate may include a protrusion that extends from the base and is in contact with the stack. The first and second substrates may each include a protrusion that extends from each of the bases and contacts the stack. The apparatus and the component may be enclosed within a housing of a device. The first or second substrates may be mechanically anchored together with an adhesive that is curable.

The at least one well may include a lower portion configured to house the predetermined amount of the adhesive and an upper portion configured to contain overflow of the adhesive as the at least one peripheral wall of the first or second substrates contacts the adhesive within the at least one well. The at least one well may include sides that extend above the upper and lower portions, and the sides may contain the adhesive and prevent overflow of the adhesive when the first and second substrates are mechanically anchored. The first substrate may include the at least one well, and the second substrate may include a protrusion that extends from the second substrate into contact with the stack. The first substrate may include the at least one well, and the second substrate may be free of contact with the stack. The second and first substrates may contact the stack, and the first and/or second substrates may include a protrusion that extends between first and/or second substrates and the stack.

The first and second substrates may be mechanically anchored at the well with an adhesive that is curable. The well may prevent overflow of the adhesive from the well to the base of the first or second substrates. The first portion may contain a predetermined amount of adhesive, and the second portion may contain overflow of the adhesive within the well when the first and second substrates are mechanically anchored. The first or second portions may diagonally intersect the first or second parallel plane. The first portion horizontally may intersect the first parallel plan, and the second portion may horizontally intersect the second parallel plane. The first substrate may contact the stack and comprises the well, and the second substrate may regulate energy and includes first and second surfaces. The first surface may contact the stack, and the second surface may contact a component that is configured to receive energy.

Aspects can have one or more of the following advantages.

The apparatuses and methods described herein provide a technique to regulate energy from a stack to a substrate and, potentially, another component separate from the stack. Since the wells provide a highly configurable connection, the substrate and the stack can be adjusted relative to each other so that the stack and the substrate have a connection that is flush and/or flat. With the flush and/or flat connection, the stack and the substrate can efficiently transfer energy between the components and extend the time before overheating of the stack.

The apparatuses described herein provide a technique to connect a substrate to a stack by using a well with adhesive to allow a connect between the substrate in the stack with a desirable surface area connection. With this connection, the substrate and the stack will have a point of contact that is substantially flat or flush, which optimizes the surface area of the point of contact and increases the amount of energy that can be transferred between the stack and the substrate. The substrate may additionally contact another component so that the energy from the stack can be transferred through the substrate to another component and, thus, provide an energy pathway between two components.

The apparatus described herein include a substrate with a protrusion that is generally centered relative to the substrate and peripheral walls that can control the gab variability between the stack and the substrate. The protrusion is configured to contact a stack between two substrates. With the protrusion of the substrate being longer than the peripheral walls of the substrate, the protrusion contacts the stack before the peripheral walls are physically obstructed by the other substrate. By using a well of adhesive, the two substrates can be connected by the adhesive, and the protrusion has a point of contact with the stack that has high surface area and, thus, high energy regulation.

The apparatuses described herein provide a substrate that can provide protection to the stack for interference with other components. For example, one substrate may be connected with one or more wells and be free of contact with the stack, and this configuration provides protection from undesirable physical interaction with other components to the stack during use or assembly of a device.

In some examples, an apparatus provides a configuration to dispose an adhesive into a well of one substrate and connect the substrate to another substrate using the adhesive, and the well holding the adhesive is configured to prevent overflow of the adhesive when the two substrates are connected. Overflow of the adhesive can cause undesirable interactions with the stack, which is positioned between two peripheral walls of the substrate having the well. Since the well has walls positioned to contain the adhesive, the substrate without the well can have varying sizes without causing a leak of the adhesive outside the well.

In some examples, methods provide a technique to connect two substrates using a curable adhesive that is deposited in a well that prevents overflow of the adhesive. By having the wells containing adhesive, the user can assemble the substrates at any angle relative to each other. Where the substrates each include peripheral walls that connect at the adhesive within the wells, a user can align a middle protrusion on one substrate with a stack of another substrate so that the connection between the middle protrusion and the stack is flush and has a high surface area. For example, if the peripheral walls of either or both of the substrates are different lengths, the well allows different levels of depth connection between the peripheral walls.

Since the well can be configured to have multiple portions (e.g., an upper and a lower portion), a predetermined amount of adhesive can be disposed within a lower portion of the well, and upon connection of the two substrates, the adhesive can form a mechanical anchor. When in an assembly line context, the multiple levels of the well can accommodate substrates having slight variations in sizes, and an amount of the adhesive may overflow onto an upper portion of the well while forming a mechanical connection between two substrates, without allowing the adhesive to leak out of the well entirely and onto the stack. This is advantageous because the same amount of adhesive can be used in many apparatuses, while the substrates can have slight variations, and the production of apparatuses can be streamlined. Since the operator will not have to apply extra adhesive to apparatuses with varying sizes of substrates, the excess adhesive can be saved and easily predicted when assembling the apparatuses.

Other features and advantages will become apparent from the following description, and from the figures and claims.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION

In some examples described herein, an apparatus is not necessarily interchangeable with a device. For example, an apparatus can include at least two substrates and a component that produces energy. A device can include at least a housing and an apparatus contained within the housing.

In some examples an apparatus includes first and second substrates that are configured to mechanically connect. Each of the substrates includes peripheral walls that extend from a base. One of the substrates includes at least one well that is integrated with its peripheral walls. With this configuration, the peripheral wall of the other substrate is mechanically anchorable within the well by using a curable adhesive. Since the mechanical connection utilizes a curable adhesive, the first and second substrates may be aligned in any fashion desirable before curing the adhesive.

For example, when the first substrate includes a stack of components, the first substrate may be connected with the second substrate such that the second substrate contacts the stack in a flush manner. With this configuration, small deviations in the sizes of the first and second substrates do not cause the second substrate to be tilted or angled because the well compensates for small variations in the contact point between the second substrate and the stack. Since the well provides a technique to have a flush connection between the second substrate and the stack, the two components have high surface area at the point of contact and can efficiently regulate the transfer of energy between the second substrate and the stack.

In other examples, the first substrate includes the stack, and the second substrate is free of contact with the stack. In this example, the second substrate can be positioned within the well so that the second substrate provides a physical barrier between the stack and other components within a larger device. This is advantageous to prevent damage to the stack during assembly or during use of a larger device.

In other examples, the well is positioned within one of the substrates and is structured to retain the adhesive while the first and second substrates are being aligned. The structure of the well allows shifts in the positions of the substrates during alignment such that the adhesive does not leak out of the well and potentially contaminate other components. After alignment, the adhesive can be cured within the well by any known manner.

Figure 1:
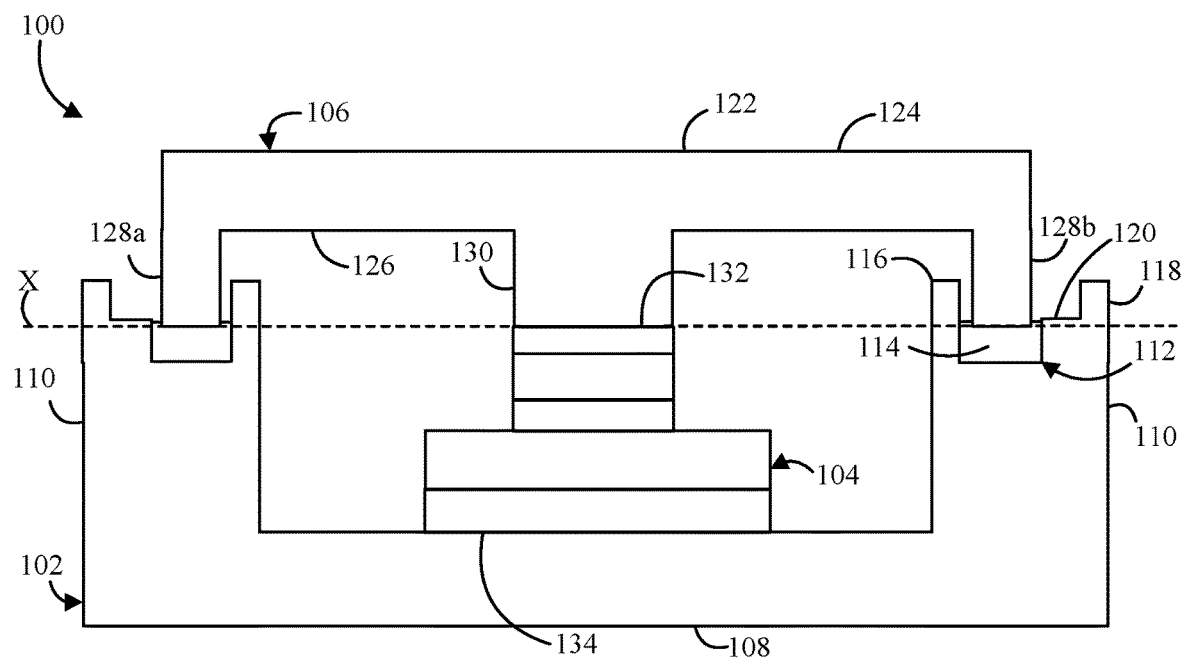
FIG. 1 is a cross-sectional side view of an apparatus.

FIG. 1 is a cross-sectional side view of an apparatus 100. The apparatus 100 includes a first substrate 102 that supports a stack 104 and a second substrate 106. The first substrate 102 supports the stack 104 at a base 108, which is enclosed on at least two sides by peripheral walls 110. In this example, the first substrate 102 has a shape of "U." In other examples, the first substrate 102 may have any shape sufficient to support the stack 104 and the second substrate 106. For example, the substrate may have a shape of a bowl (i.e., enclosing the stack 104 on at least four lateral walls), a "V," a reversed U-shape, or any combination thereof. The peripheral walls 110 extend from the base 108 in a generally perpendicular angle (i.e., about 90 degrees). In other examples, the peripheral walls 110 may extend away from the base 108 at any angle sufficient to support the stack 104 and the second substrate 106, such as at an angle of about 35 degrees to about 135 degrees relative to a horizonal axis of the base 108.

Each of the peripheral walls 110 include a well 112 for holding an adhesive 114 that mechanically anchors the first substrate 102, the stack 104, and the second substrate 106. The well 112 has the shape of a container or bowl so that the adhesive 114 does not spill into the interior of the first substrate 102 and drip down to the base 108, which would potentially contaminate the stack 104. In this example, the well 112 has an inner wall 116, an outer wall 118, and lateral walls (not shown but connect the outer and inner walls 116, 118) so that the adhesive 114 does not leak out of the well 112. As shown in FIG. 1, the adhesive 114 is contained between the inner wall 116 and an extension 120 of the outer wall 118. The extension 120 has a shape of a box or a square so that when adhesive 114 overflows from lateral sides of the extension 120 the inner and outer walls 116, 118 contain the adhesive 114 within the well 112. In other examples, the extension 120 may be configured as any shape sufficient to house the adhesive 114 when the first and second substrates 102, 106 connect.

For forming the backbone of the second substrate 106, a base 122 having top and bottom surfaces 124, 126 extends from one peripheral wall 128a to the other peripheral wall 128b, both of which are positioned at the bottom surface 126. A protrusion 130 extends from the base 122 and contacts the first end 132 of the stack 104 so that the second substrate 106 is at least partially supported by the stack 104. The peripheral walls 128a, 128b and protrusion 130 extend from the base 122 at a generally perpendicular angle so that the peripheral walls 128a, 128b and protrusion 130 have the shortest distance between the base 122 and the point of contact on the stack 104 and/or first substrate 102.

Figure 2:
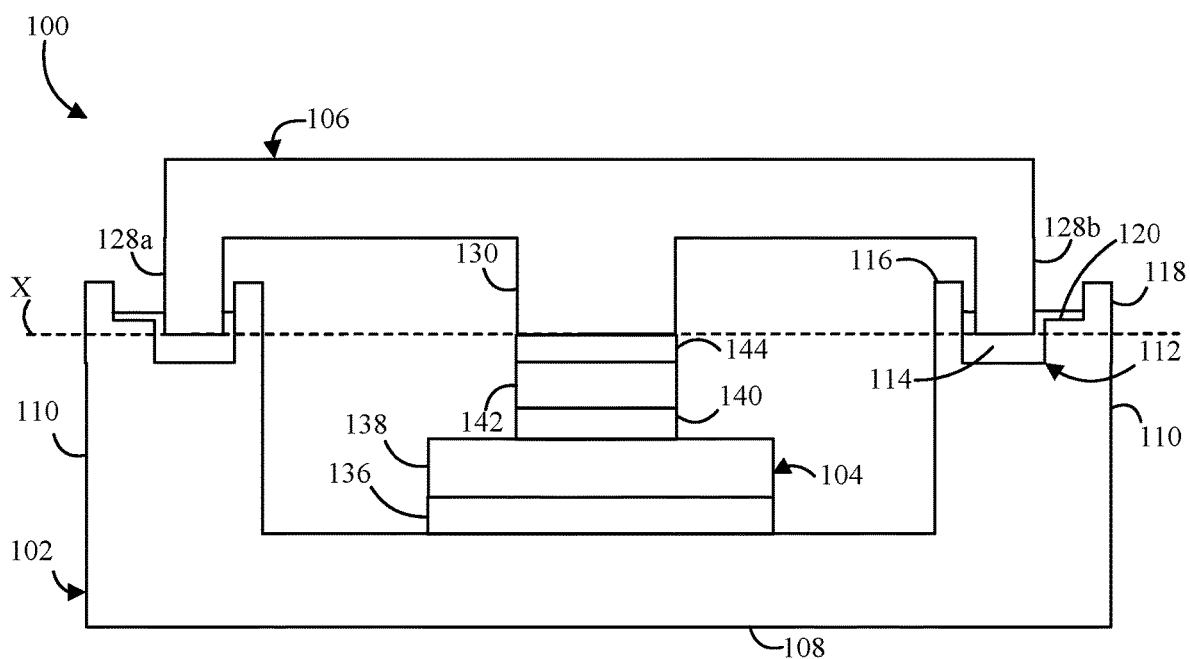
FIG. 2 is a cross-sectional side view of another apparatus.

The protrusion 130 has a polished surface at the point of contact with the stack 104 (i.e., the first end 132) to have a point of between the second substrate 106 and the stack 104 with a high amount of surface area. The high amount of surface area between the protrusion 130 and the first end 132 creates a highly efficient pathway for the regulation of energy between the stack 104 and the second substrate 106. For example, when the stack generates a substantial amount of energy (e.g., thermal energy), the contact portion between the protrusion 130 and the first end 132 allows the second substrate 106 to receive energy from the stack 104. In FIGS. 1 and 2, the protrusion 130 is shown as having a length that is substantially the same as a length of the peripheral walls 128a, 128b. In some examples, the protrusion 130 has a length that is more than a length of peripheral walls 128a, 128b so that the protrusion 130 contacts the stack before the peripheral walls 128a, 128b contact peripheral walls 110. In other examples, the protrusion 130 has a length that is shorter than a length of the peripheral walls 128a, 128b. The surface of the protrusion 130 is made by a grinding tool so that the surface is as flat as possible, which may be subjected to additional polishing by any known technique used to make surfaces smoother. The stack 104 may include any component at the first end 132 such that contact with the protrusion 130 has a high surface area. The stack 104 may also be highly polished at the first end to increase the surface area of the point of contact. With this configuration, the second substrate 106 can assist the stack 104 with longer operation times and to avoid overheating by efficiently regulation the transfer of energy.

On the other end, the stack 104 contacts the base 108 of the first substrate 102 at a second end 134 of the stack 104. The contact point between the second end 134 and the base 108 and/or the contact point between the first end 132 and the protrusion 130 are substantially flush so that one or more lateral walls of the stack 104 are generally perpendicular relative to the bases 108, 122 and are generally parallel relative to the lateral walls of the protrusion 130. By having a connection that is flush, the assembly of apparatuses 100 is more easily controlled at a large scale because the stack is sufficiently supported at the base 108 and, thus, can at least partially support the second substrate 106.

As shown in FIG. 1, the peripheral walls 128a, 128b and protrusion 130 are coplanar along an X axis (i.e., a horizontal axis) relative to each other. With the coplanar configuration, a user observing the assembly of the apparatus 100 can determine if any obvious defects exist in either the second substrate 106 and/or the stack 104 due to one of the second substrate 106 and/or stack 104 having a unaligned (i.e., non-parallel) surface relative to the other component. Additionally, the coplanar configuration can assist the operator with determining how much adhesive 114 is required to form an adequate connection at between the first and second substrates 102, 106. For example, if the stack 104 has a height that is tall, more adhesive may be needed in the well 112 to sufficiently anchor the first and second substrates 102, 106 together, and in other examples where the stack 104 has a height that is shorter, less adhesive 114 may be needed in the well 112.

The first and/or second substrates 102, 106 function to assist the stack 104 with functioning properly and free of obstructions. For example, the first and/or second substrates 102, 106 are configured to mechanically anchor without leaking any adhesive onto the base 108, which could potentially contaminate the stack 104. The first and second substrates 102, 106 may be configured in combination to prevent physical interference during assembly or operation of a larger device by acting as a barrier. The first and/or second substrates 102, 106 may be composed of any material sufficient to properly support the stack 104 and/or regulate the transfer of energy from the stack. For example, the first and/or second substrates 102, 106 may be configured as a heatsink, a conductor, a support, an insulator, or any combination thereof. For example, the first and/or second substrates 102, 106 may be configured as a thermal insulator, electrical insulator, thermal conductor, electrical conductor, or any combination thereof. The first and/or second substrates 102, 106 may include one or more of ceramic, a metal, a polymer, a glass, or any combination thereof. The first and/or second substrates 102, 106 may have any length extending across the bases 122, 108 that is sufficient to support or cover the stack 104. For example, first and second substrates 102, 106 may have a length of about 0.5 mm to about 100 mm or more. One or both of the first and second substrates 102, 106 may include a protrusion 130 that extends in similar fashion as the peripheral walls 128a, 128b, 110. The protrusion 130 may have any height and/or width sufficient to contact and/or support the stack 104 on one or both of the first and second substrates 102, 106.

The peripheral walls 128a, 128b, 110 function to provide an anchor point between the first and second substrates 102, 106. The peripheral walls 128a, 128b, 110 may have any configuration sufficient to include one or more wells 112 or connect with one or more wells 112 on another of the peripheral walls 128a, 128b, 110. For example, the peripheral walls 128a, 128b, 110 may be angled related to bases 108, 122 of the first and second substrates 102, 106 to accommodate different confirmations of stacks 104 or to assist with arranging the apparatus 100 within a large device (see e.g., device 101 of FIG. 4). For example, the peripheral walls 128a, 128b, 110 may each independently have an angle relative to the bases 108, 122 of about 35 degrees to about 90 degrees. The peripheral walls 110, 128a, 128b may have any height or width sufficient to form a mechanical connection between the first and second substrates 102, 106 at the wells 112. For example, the peripheral walls 110, 128a, 128b may have a height of about 0.1 mm to about 10 mm. In some examples, the peripheral walls 128a, 128b, 110 may have a height and width that allows for insertion into the wells 112 (see e.g., FIGS. 1-2 and 4), and in other examples, the peripheral walls 128a, 128b, 110 may have a height and width that prevents insertion into the well 112 (see e.g., FIG. 5A) so that another element (e.g., the projection 119 of FIG. 5A) forms a connection with the adhesive 114 at the well.

The stack 104 functions to assist with one or more electrical operations of a larger device and, hence, can generate substantial energy. In the examples of FIGS. 1-3 and 5A-5B, the stack 104 (see also, stacks 204, 304) generates energy, and any thermal energy that is generated is ultimately transferred from the stack 104 to the second substrate 106 so that the stack 104 has a prolonged operation time and does not overheat from use. The stack 104 includes at least five distinct components and/or layers, as shown. In other examples, the stack 104 may include as many components as required to assist with one or more electrical operations or with mechanical support of the overall stack 104. For example, the stack 104 may include between one and ten layers or more. In some examples, the stack 104 is free of contact with first substrate 102 on all sides except for the bottom side of the stack 104. In some examples, the stack 104 contacts the second substrate 106 at more than one side, such as at a top side and one or more lateral sides of the stack 104 so that additional energy is transferred the second substrate due to points of contact with more surface area. The stack 104 may have any height extending from the first end 132 to the second end 134 sufficient to accommodate varying configurations of components within the stack 104. For example, the stack 104 may have a height of about 0.1 mm to about 10 mm.

The wells 112 function to hold the adhesive 114 in a contained space so that the adhesive 114 does not contaminate the base 108 and/or the stack 104. The well 112 may be disposed within the top surface of the peripheral walls 110, and the well 112 and the peripheral walls 110 may extend all the way around in the stack 104 in the shape of a circle, square, rectangle, triangle, or any other shape sufficient to laterally enclose the stack 104 within the first substrate 102. The well 112 within the peripheral walls 110 may have any shape sufficient to contain to the adhesive 114 within the inner and outer walls 116, 118 when the second substrate 106 is bound to the first substrate 102 and prevent the adhesive 114 from leaking into the base 108 and/or the stack 104. For example, the well 112 may have a shape of a wedge where the extension 120 is diagonal surface extending from the bottom of the well 112 to a top edge of the outer wall 118. In another example, the well 112 may have a shape of a bowl or cup and be free of the extension 120. In another example, the well 112 may include a space between the extension 120 and the outer wall 118 so that, if the adhesive 114 overflows onto the extension 120, the excess adhesive 114 flows into the space between the outer wall 118 and the extension 120. In another example, the well 112 includes an extension 120 protruding from the inner and outer walls 116, 118, such as when the well 112 has a shape of a cone.

The extension 120 functions to form a shape of the well 114 sufficient to contain the adhesive 114 regardless of the height of the stack 104 and/or protrusion 130. The extension 120 may separate upper and lower portions of the stack (see e.g., lower and upper portions 121, 123 of FIG. 5A). The extension 120 may have any shape sufficient to hold a predetermined amount of adhesive 114 within the well 112. The extension 120 may have angled or curved surfaces relative to either or both of the inner and outer walls 116, 118. For example, the extension 120 may have a shape of a triangle, wedge, circle, oval, trapezoid, or any combination thereof. The extension 120 may have any height sufficient to support the well 112 with containing the adhesive. The height is measured from a top surface of the extension 120 of the well 112. For example, extension 120 may have a height of about 0.05 mm to about 5 mm. The extension 120 may have a width extending from a lateral wall of the extension 120 to a lateral wall of the outer wall 118. The extension 120 may have any width sufficient to form a depository for a predetermined amount of adhesive 114 within the well 112. For example, the extension 120 may have a width of about 0.05 mm to about 5 mm.

The adhesive 114 functions to mechanically anchor the first substrate 102, the stack 104, and the second substrate 106 together. The adhesive 114 may be include any component sufficient to provide mechanical connection between two or more components. For example, the adhesive 114 may include one or more of an epoxy, polyurethane, urethanes, methyl methacrylates, cyanoacrylates, phenol-formaldehydes, polysiloxane, natural adhesives, resins thereof, derivatives thereof, or any combination thereof. When applied, the adhesive 114 may be cured or activated my any means sufficient to create permanent adhesion between two or more components. For example, the adhesive 114 may be cured by one or means including radiation (e.g., UV cure), heat, anaerobic, ambient air, moisture, or any combination thereof. The adhesive 114 may be a one-part or a two-part (e.g., methyl methacrylates, urethanes, epoxies) adhesive. The adhesive 114 may be applied by any means known to the skilled artisan, such as simply depositing the adhesive 114 into the well 112. The adhesive 114 may be applied in any predetermined amount sufficient to mechanically anchor two or more components together. For examples, the adhesive 114 may be applied in an amount of about 0.00000001 mL to about 1 mL. The adhesive 114 may be applied before or after contacting the stack 104, the first substrate 102, the second substrate 106, or any combination thereof so that a user can determine a precise amount of adhesive 114 that would form the mechanical anchor between the components. Additional adhesive 114 may be applied to the well 112 after insertion of the peripheral walls 128a, 128b of the second substrate 106, if the wells 112 do not have enough adhesive 114 in each well 112 to contact at least a portion of each of the peripheral walls 128a, 128b.

FIG. 2 is a cross-sectional view a side of another apparatus 100. The apparatus 100 includes the substrate 102 that is connected with the stack 104 and the second substrate 106 in a similar fashion as the apparatus 100 of claim 1. Any or all of the elements of FIG. 2 may have substantially similar properties as the elements described in relation to FIG. 1.

As compared to FIG. 1, the height of the stack 104 in FIG. 1 is greater than a height of the stack 104 of FIG. 2. As shown, the wells 112 of FIGS. 1 and 2 accommodate different sizes of stacks 104, while using the same amount of adhesive 114. Any one of the components of the stack 104, such as the binders 136, 140, the die 138, the companion chip 142, or any combination thereof, may have a height that varies slightly among different apparatuses. Additionally, the first and second substrates 102, 106 may have heights at the protrusions 130 and/or peripheral walls 128a, 128b, 110 that varies between apparatuses 100. With the configuration of the wells 112, small variations in the stack 104 and/or the first and second substrates 102, 106 do not impact the amount of surface area that contacts at the stack because the wells 112 provide for an overflow of adhesive 114 in the event of a variation in sizes of the components.

As shown in FIG. 1, the adhesive 114 remains below the extension 120 while the peripheral walls 128a, 128b are mechanically anchored. On the other hand, in FIG. 2, the peripheral walls 128a, 128b displace a portion of the adhesive 114 so the adhesive 114 flows over the extension 120. Both FIGS. 1 and 2 have the same predetermined amount of adhesive 114. As the adhesive 114 is displaced over the extension 120, the adhesive 114 is contained within the inner and outer walls 116, 118 that extend above the extension 120 so that the adhesive 114 does not leak into the base 108 of the first substrate 102 and potentially contaminate the stack 104. This is advantageous when assembling many apparatuses 100 on an assembly line or the like because the same amount of adhesive can be deposited within wells to form mechanical connections among components with small variations.

The binder 136, 140 functions to mechanically hold other portions of the stack together. The binder 136, 140 may include any component sufficient to create a mechanical connection between two components of the stack 104 and/or one component of the stack and one of the first or second substrates 102, 106. For example, the binder 136, 140 may include one or more components or materials as the adhesive 114. The binder 136, 140 may have any form sufficient to create the mechanical connection and/or provide structural stability for the stack 104. For example, the binder 136, 140 may have the form of a tape, a film, a gel, gap filler, electrical interconnection, solder, solder paste, or any combination thereof. The binder 136, 140 may additionally include one or more materials that increase the conductivity of the binder. For example, the binder 136, 140 may include metals, silicone, grease, epoxy, electrical interconnection, solder, solder paste or any combination thereof.

The die 138 may function as a chip made from a semiconductor material. The die 138 may include any material sufficient to function as a chip. For example, the die 138 may include silicon, indium phosphide, or any combination thereof. The die 138 may be configured as a ceramic or organic substrate to increase the reach between the substrates. The die 138 may function as an opto-electrical component that is amplified by another component of the stack 104, such as the companion chip 142.

The companion chip 142 may function as another chip made from a semiconductor material. The companion chip 142 may function as a complimentary chip relative to the die 138. The companion chip 142 may include any material sufficient to amplify energy from the die 138. For example, the companion chip 142 may include silicon, indium phosphide, or any combination thereof. The companion chip 142 may be interconnected or cemented with the host chip by a ball grid array, copper pillars, or both.

The thermal interface material 144 functions to provide a connection point between the stack 104 and the second substrate 106. The thermal interface material 144 may include any material sufficient to regulate the transfer of energy between one or more components of the stack 104 and the second substrate 106. For example, the thermal interface material 144 may include any material described with respect to the adhesive 114. The thermal interface material 144 may have a sufficiently smooth surface such that the second substrate 106 and the thermal interface material 144 have a point of contact with a high surface area. Between stacks 104 of different apparatuses, the thermal interface material 144 may have varying heights, and the height of the thermal interface material 144 may be any height sufficient to form a connection with the second substrate 106. For example, the thermal interface material 144 may have a height of about 0.005 mm to about 1 mm.

Figure 3:
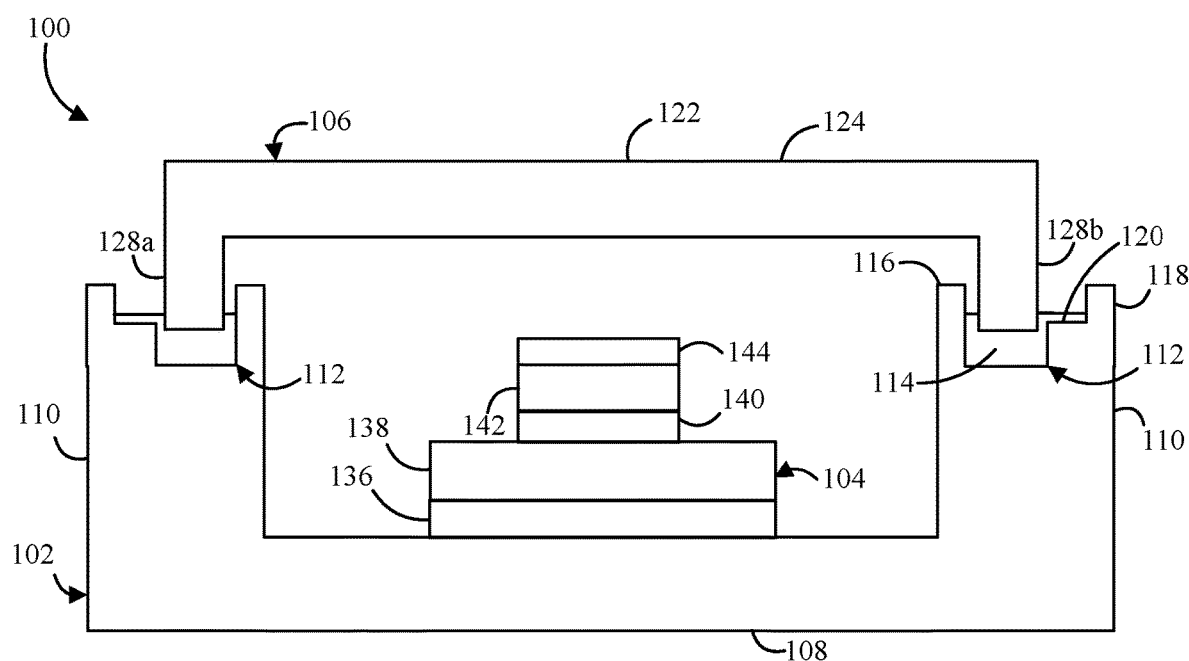
FIG. 3 is a cross-sectional side view of another apparatus.

FIG. 3 is a cross-sectional side view of another apparatus 100. In this example, the first and second substrates 102, 106 are mechanically anchored at the well 112 so that the stack 104 is contained within the first and second substrates 102, 106. Specifically, the peripheral walls 128a, 128b are inserted into the well 112 of the other peripheral walls 110 and is mechanically anchored at the well 112 by the adhesive 114. Based on the individual height of the peripheral walls 128a, 128b, an amount of adhesive 114 is displaced upon contact of the peripheral walls 128a, 128b and overflows to a top surface of the extension the extension 120. Above the top surface of the extension 120, the inner and outer walls 116, 118 prevent overflow or leaking of the adhesive 114 when one or both of the peripheral wall (e.g., peripheral wall 128a) displaces more adhesive than the other peripheral walls (e.g., 128b).

Even though the stack 104 is free of contact with the second substrate 106 in FIG. 3, the second substrate 106 may be aligned within the well 112 so that the second substrate 106 covers a top portion of the stack 104. For example, when the peripheral walls 128a, 128b are different heights, the base 122 of the second substrate 106 may be angled relative to the top portion of the stack 104, but the second substrate 106 still covers the stack 104 from physical interaction with the external environment. Since the second substrate 106 covers a top portion of the stack 104, the stack 104 is protected from interference during assembly and or use of the apparatus 100 or larger device (e.g., when the apparatus 100 is positioned within a housing of a larger device, such as a camera, phone, computer, or other electronic device). For example, the second substrate 106 may obstruct dust particles or moisture from contacting the stack 104. Additionally, the height of the second substrate 106 relative to the stack 104 and/or first substrate 102 can be controlled by using the variable depth of wells 112 to adjust the desired height and, subsequently, fix the height by curing the adhesive 114.

Although not shown in FIG. 3, where the first and second substrates 102, 106 have a form of an enclosure when mechanically anchored, the second substrate 106 is free of contact with stack 104 and does not conduct energy from the stack 104. The peripheral walls 128*a*, 128*b*, 110 and the well 112 may extend around the stack 104 to form an enclosed structure, like a bowl or a box, and when the adhesive 114 is cured, the apparatus 100 may be sealed and substantially airtight or watertight. If the first and second substrate 102, 106 are configured as an enclosure, the first and/or the second substrates 102, 106 may transfer energy from the stack 104 via convection so that the stack 104 does not overheat.

Figure 4:
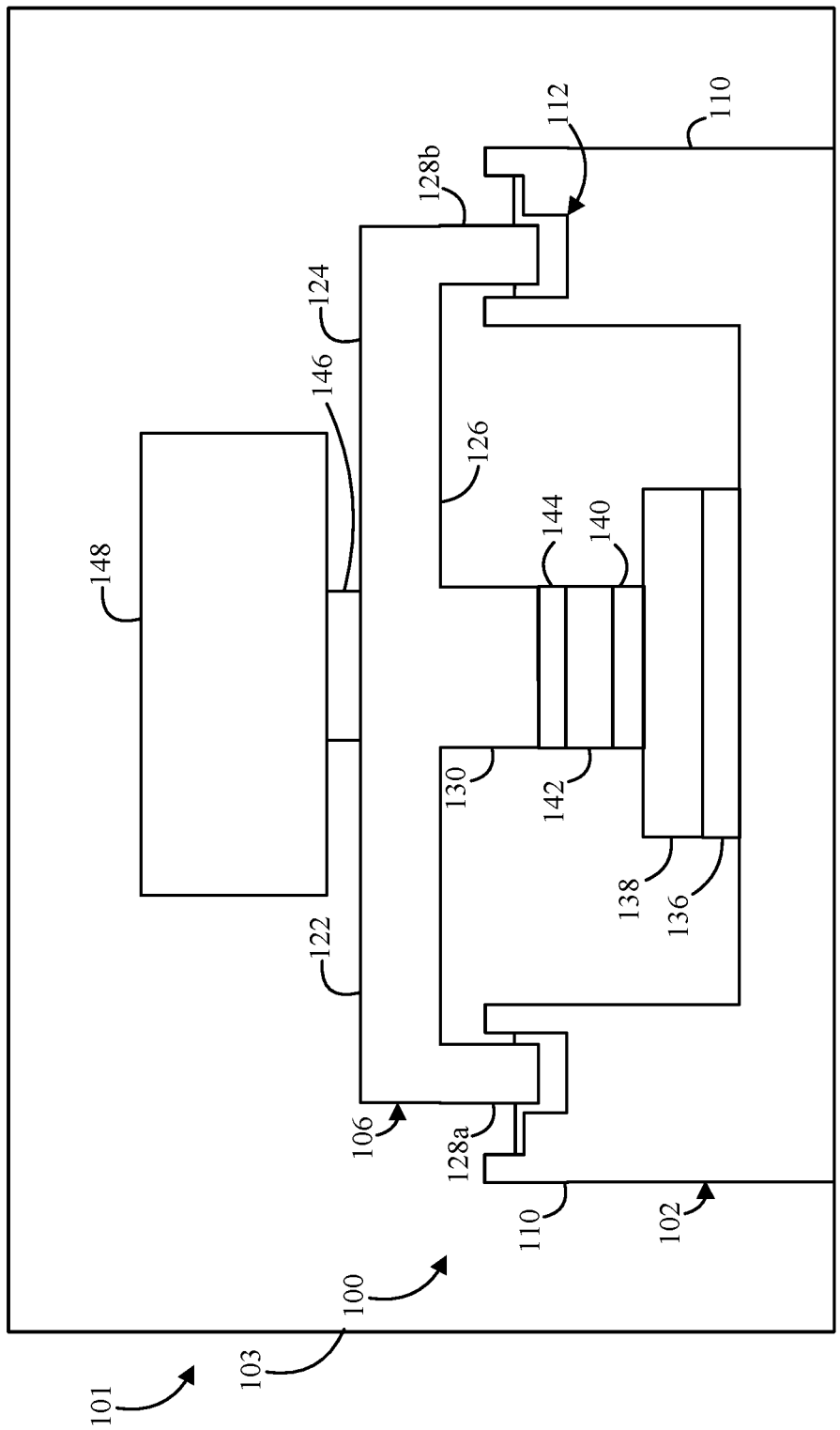
FIG. 4 is a cross-sectional side view of a device including another apparatus.

FIG. 4 is a cross-sectional side view of a device 101 including another apparatus 100 enclosed within a housing 103. The device 101 may be anything that includes electronic modules, such as a camera, a computer, a phone, an analytical instrument, or any other electronic device. The housing 103 may have any shape sufficient to enclose the apparatus 100 into the device 101 so that the apparatus 100 is free of contact with an environment that is external to the device 101. The device 101 includes a component 148 connected with the apparatus 100 by a thermal interface material 146 at the base 122 of the second substrate 106. In other examples, the device 101 may include other components that are connected with the apparatus 100 or free of contact with the apparatus 100. For example, the apparatus 100 may contact two or more components (not shown) with or without a thermal interface material 146, and the first and/or second substrates 102, 106 may be configured to transfer energy from the stack 104 to the two or more other components.

The thermal interface material 146 may function to provide a connection means between the component 148 and a top surface 124 of the second substrate. The thermal interface material 146 may be any material that can mechanically connect the component 148 and the second substrate 106 and/or provide an energy pathway between the second substrate 106 and the component 148. For example, the thermal interface material 146 may include an adhesive that is configured to regulate the transfer of energy. The thermal interface material 146 may include one or more material of the thermal interface material 144 or the adhesive 114. For example, the thermal interface material 146 may include any material described with respect to the adhesive 114 that would allow for the regulation of energy between two components. The thermal interface material 146 may have any height sufficient to regulate the transfer of energy from other components of the stack 104. For example, the thermal interface material 146 may have a height of about 0.005 mm to about 1 mm. The thermal interface material 146 may cover a portion of the base 122 or may cover all the top surface 124 of the base 122. The thermal interface material 146 may contact portions of the second substrate 102 that are not illustrated herein, such as lateral walls of the second substrate 106.

The component 148 functions to receive energy from the second substrate 106. The component 148 may include any element or conductive material sufficient to receive energy from the second substrate 106. The component 148 may be configured as one or more of a heatsink, a ground, an electrical component, liquid cooler, or any combination thereof. The component 148 may have any size or shape sufficient to connect with the second substrate 106 and/or the thermal interface material 146. In some examples, the component 148 may have a length that is equal to a length of the top surface of the base 122 of the second substrate 106 so that the component 148 and the base 122 have a point of contact with optimal surface area, which improves the efficiency of transferring energy between the second substrate 106 and the component 148.

Figure 5A:
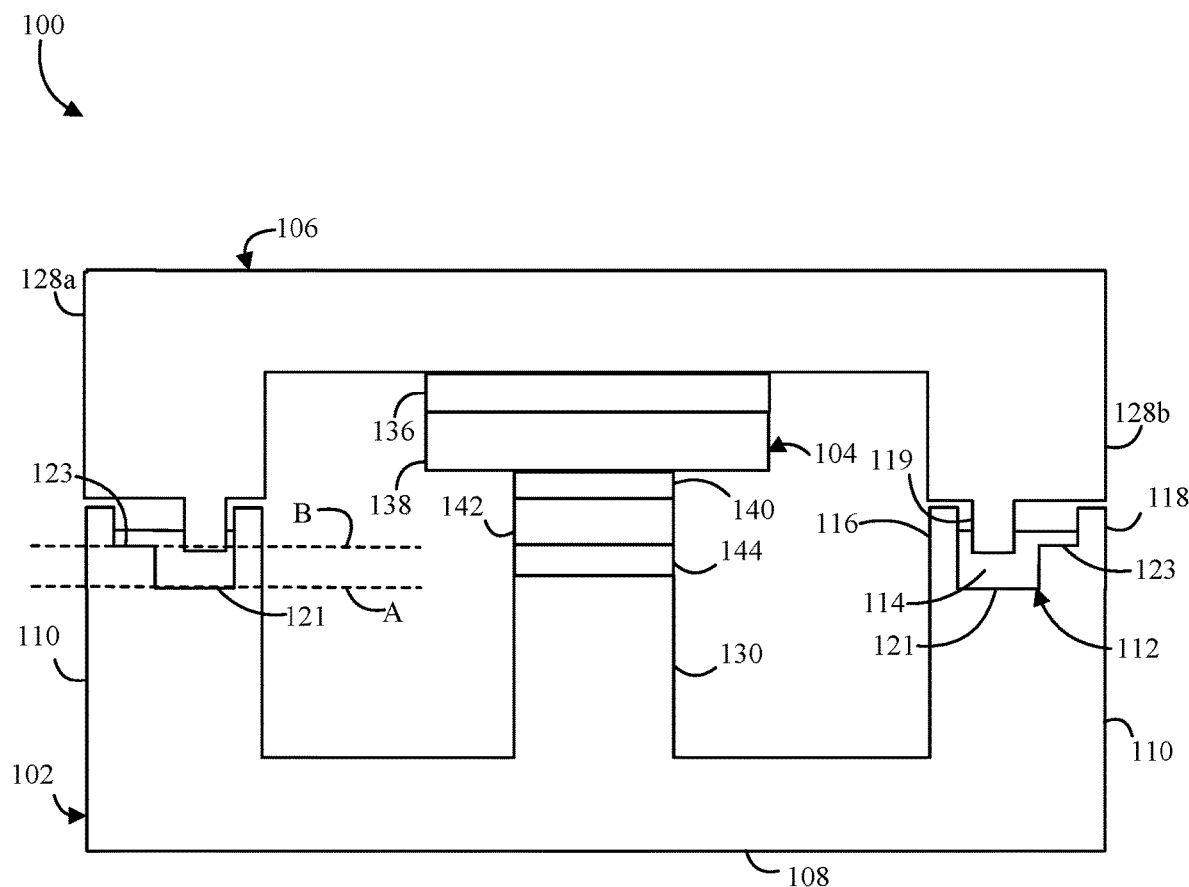
FIG. 5A is a cross-sectional side view of another apparatus.

FIG. 5A is a cross-sectional side view of another apparatus 100. In this example, the first substrate 102 includes the protrusion 130 and the well 112, and the stack 104 is contacted with the first and second substrates 102, 106. Although not shown in FIG. 5, in some examples, the second substrate 106 may also include the protrusion 130 (see e.g., protrusion 130 of FIGS. 1-2 and 4) so that the protrusions 130 sandwich the stack 104 between the first and second substrates 102, 106. In this example, the stack 104 has a reverse order relative to the other examples (i.e., FIGS. 1-4) to illustrate that the stack 104 can be first formed, at least in part, on the second substrate 106 and then vertically lowered into contact with the first substrate 102. For example, the binder 136, the die 138, the binder 140, and the companion chip 142 may be disposed on the second substrate 106, and the thermal interface material 144 may be disposed on the first substrate 102, before contacting the first and second substrates 102, 106 at the well 112.

In this example, the second substrate 106 includes projections 119 that extend into the well 112 from the peripheral walls 128*a*, 128*b*. A predetermined amount of adhesive 114 is deposited within the well 112 at a lower portion 121, and an upper portion 123 would be free of contact with the adhesive 114 before the projections 119 are inserted into the well. The inner and outer walls 116, 118 surround the lower and upper portions 121, 123 of the well 112 so that no adhesive leaks from the well 112 due to overflow or displacement stemming from insertion of the projections 119 into the well 112. Because the projections 119 are configured to insert within the well 112, the peripheral walls 128, 128*b* are prevented from entering the well 112 and simply rest on or contact with top portions of the inner and outer walls 116, 118.

As shown, the lower portion 121 intersects a first plane A the extends parallel relative to the bases 108 and the stack 104. The upper portion 123 intersects a second plane B that extends parallel relative to the base 108 and the stack 104. In this example, the upper portion 123 and the lower portion 121 intersect the first and second planes A, B such that the upper and lower portions 123, 121 are parallel. In other examples, the upper and/or lower portions 123, 121 may intersect the first and/or second planes at an angle (i.e., diagonally). The angle of intersection of the portions and the planes may be any angle, such as about 1 degree to about 180 degrees. As shown in FIG. 5, the well 112 in this example only illustrates lower and upper portions 121, 123 (similarly to the extensions 120 of FIGS. 1-2), and in other examples, the well 112 may have multiple portions, such as lower, middle, and upper portions. The well 112 can include as many portions sufficient to contain adhesive 114 and mechanically anchor the first and second substrate 102, 106. The well 114 can have more than a first and second plane A, B to describe the relation of the multiple portions within the well. Having additional portions within the well 114 allows for variation in the sizes of the first and second substrates 102, 106, while using the same amount of adhesive 114 between apparatuses 100.

The projections 119 function to provide a mechanical anchor of the second substrate 106 to the first substrate 102. The projections 119 may have any height sufficient to extend from the peripheral walls 128a, 128b to the lower portion 121 of the well 112 so that the projections 119 contact the adhesive 114. The projections 119 may have a height sufficient to prevent the peripheral walls 128a, 128b from inserting within the wells 112. In some examples, the peripheral walls 128a, 128b may have a width that also prevents insertion into the wells 112. In some examples, the peripheral walls 128a, 128b are free of contact with the peripheral walls 110, and only the projections 119 provide a connection means between the first and second substrates 102, 106. For example, the stack 104 may have a height such that the peripheral walls 128a, 128b are prevented from contacting the peripheral walls 110 by a space.

Figure 5B:
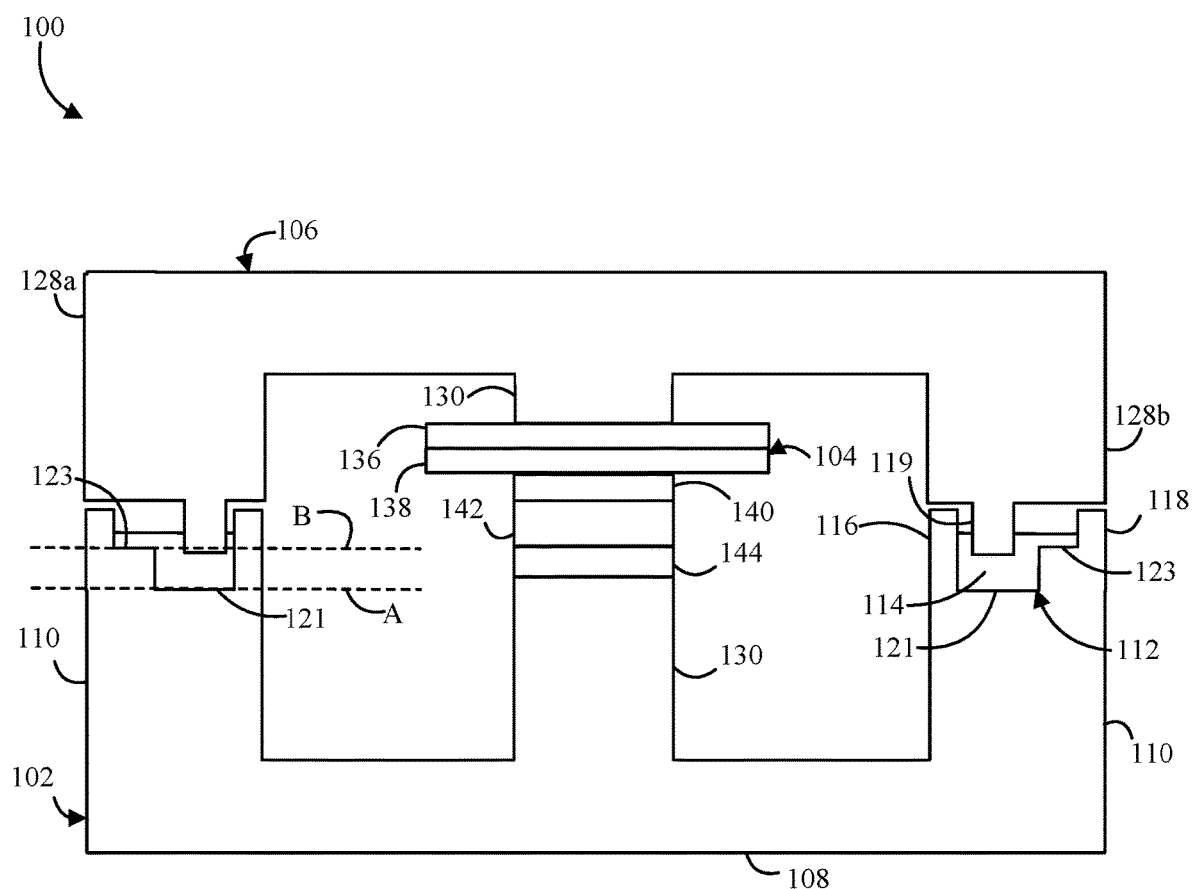
FIG. 5B is a cross-sectional side view of another apparatus.

The present disclosure provides a method of assembling the apparatus 100. In the method, the first or second substrates 102, 106 may include the well 112 for depositing the adhesive 114, and the first and second substrates 102, 106 may each contact the stack 104 (see for example, FIGS. 1-2 and 4-5B). In some examples, the stack 104 may only contact one of the first or second substrates 102, 106 because one of the first or second substrates 102, 106 is being used a physical barrier for the stack 104 relative to an external environment (see e.g., FIG. 3). In the methods, the first and/or second substrates 102, 106 may include a protrusion 130 that is generally positioned to contact the stack 104. Where one or both of the first and second substrates 102, 106 include the protrusion 130, the protrusion 130 may contact the stack 104 1) when the first or second substrates 102, 106 are contacted with the stack 104; and/or 2) when the first and second substrates 102, 106 are contacted with each other. FIG. 5B illustrates a cross-section of another apparatus 100 that includes a protrusion 130 on each of the first and second substrates 102, 106 that contact the stack 104.

The method has two initial steps that may be performed in any order: 1) the stack 104 is contacted with the first or second substrates 102, 106; and 2) a predetermined amount of adhesive 114 is deposited within the well 112. The initial steps may be performed in any order because these are precursor steps to contacting the first and second substrates 102, 106. In some examples, the adhesive 114 is deposited or disposed within the well 112 after both the first and second substrates 102, 106 contact the stack 104. After depositing the adhesive 114 and contacting the stack 104 with the first or second substrates 102, 106, the first and second substates 102, 106 are contacted at the well 112 so that the adhesive 114 is contacting both the first and second substrates 102, 106. After contacting and/or adjusting the first and second substrates 102, 106, the adhesive 114 may be cured by any known method or technique described herein or known by the skilled artisan.

Contacting the stack 104 with the first or second substrate 102, 106 may be split into two steps: 1) a first portion of the stack 104 may be first contacted with the first or second substrates 102, 106; 2) a second portion of the stack 104 may be contacted with the other of the first or second substrate 102, 106 that does not contact the first portion. Then, as the first and second substrates 102, 106 are moved into contact with each other, the first and second portions of the stack 104 may simultaneously contact with each other to form the apparatus 100. In this example, the first portion may include one or more of the binder 136, the die 138, the other binder 140, the companion chip 142, and/or the thermal interface material 144. The second portion may include the remaining components that are not included with the first portion.

After contacting the first and second substrates 102, 106, the first and second substrates 102, 106 may be adjusted so that the stack 104 has a connection that is flush with the first and/or second substrates 102, 106, which improves the efficiency of energy conduction. The adjustments to the first and second substrates 102, 106 may include tilting or angling the first or second substrates 102, 106 within the well 112 so as to have a desirable alignment with the stack 104. The adjustments may cause the adhesive 114 to be displaced within the well 114, and the well 114 is configured to prevent displacement or overflow of the adhesive 114 out of the well 112 and onto a base 108, 122 of the first or second substrates 102, 106. For example, the predetermined amount of adhesive 114 may be deposited within a lower portion of the well, and displacement of the adhesive 114 by the peripheral walls 110, 128a, 128b of the first or second substrate 102, 106 may cause some of the adhesive to overflow from the lower portion to the upper portion, without allowing the adhesive 114 to leak outside of the well. With this configuration, the predetermined amount of adhesive 114 may be used in an assembly of many apparatuses 100, and small deviations in the dimensions of the first and second substrates 102, 106 allow the apparatuses 100 to be formed without adjusting the amount of adhesive 114; with adjusting of the first and/or second substrate 102, 106 to desirable alignment, and without risking leaking of the adhesive 114 between individual apparatus 100 assembly.

While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. An apparatus, comprising:
   first and second substrates, each of the first and second substrates comprising:
      a base; and
      at least one peripheral wall extending from the base, wherein one of the at least one peripheral walls of the first or second substrates includes at least one well defined within the at least one peripheral wall as a container so that adhesive does not leak from the at least one peripheral wall, and wherein the other of the at least one peripheral walls of the first or the second substrates that does not include a well is mechanically anchored to the well by the adhesive;
   a stack having first and second ends, the stack disposed on the base of the first and/or the second substrates at the first and/or second ends, the stack comprising at least one element configured to generate thermal energy,
   wherein the first substrate comprises a protrusion that extends from the base and is in contact with the stack.

2. The apparatus of claim 1, wherein the first and second substrates each include first and second surfaces, wherein the first substrate is in contact with the stack at the first surface, and wherein the second substrate comprises a protrusion that extends between the second surface of the second substrate and the stack.

3. The apparatus of claim 1, wherein the first and second substrates each comprise a protrusion that extends from each of the bases and contacts the stack.

4. The apparatus of claim 1, wherein the apparatus and another component that is connected with one of the first or second substrates are enclosed within a housing of a device, the component configured to receive thermal energy from the first or the second substrates.

5. The apparatus of claim 1, wherein the at least one peripheral walls of the first or second substrates laterally extend around the stack to form an enclosure.

6. The apparatus of claim 2, wherein the first surface of the second substrate is in contact with a component, wherein the component is configured to receive thermal energy, and wherein the second substrate is configured as a conductor that facilitates the transfer of thermal energy between the stack and the component.

7. A method of assembling an apparatus, comprising:
contacting a stack with a base of first or second substrates, one of the first or second substrates comprising at least one peripheral wall that extends from the base and that defines at least one well that is structured to contain an adhesive, wherein the at least one well comprises a lower portion configured to house the predetermined amount of the adhesive, and an upper portion configured to contain overflow of the adhesive as the at least one peripheral wall of the first or second substrates contacts the adhesive within the at least one well;
disposing a predetermined amount of the adhesive within the at least one well;
contacting at least one peripheral wall of the other of the first or second substrates that does not include the at least one well and the adhesive disposed within the at least one well; and
curing the adhesive so that the first and second substrates are mechanically anchored to each other by the adhesive.

8. The method of claim 7, wherein the at least one well comprises sides that extend above the upper and lower portions, and the sides are configured to contain the adhesive and prevent overflow of the adhesive when the first and second substrates are mechanically anchored.

9. The method of claim 7, wherein the first substrate comprises the at least one well, and wherein the second substrate is free of contact with the stack.

10. The method of claim 7, wherein the second and first substrates contact the stack, and wherein the first and/or second substrates include a protrusion that extends between first and/or second substrates and the stack.

11. The method of claim 8, wherein the first substrate comprises the at least one well, and wherein second substrate includes a protrusion that extends from the second substrate into contact with the stack.

12. An apparatus, comprising:
first and second substrates, each comprising
a base configured to support a stack; and
at least one peripheral wall extending from the base,
wherein one of the first or second substrates comprises a well defined within the at least one peripheral wall so that adhesive is contained within the well and does not leak outside of the at least one peripheral wall, and wherein the well comprises (1) a first portion that has a bottom surface that intersects a first plane parallel to the base, and (2) a second portion that has a bottom surface that intersects a second plane parallel to the base, where the first plane is closer to the base than the second plane, and
wherein the first and second substrates are mechanically anchored at the well by the adhesive,
wherein the first substrate contacts the stack and comprises the well, wherein the second substrate is configured to regulate thermal energy and includes first and second surfaces, wherein the first surface contacts the stack, and wherein the second surface contacts a component that is configured to receive thermal energy.

13. The apparatus of claim 12, wherein the at least one peripheral wall of the first and second substrates laterally extend around the stack to form an enclosure.

14. The apparatus of claim 12, wherein the first or second portions diagonally intersect the first or second parallel plane.

15. The apparatus of claim 12, wherein the first portion horizontally intersects the first parallel plane, and wherein the second portion horizontally intersect the second parallel plane.

16. The apparatus of claim 12, wherein the at least one peripheral walls of the first or second substrates that include the well are sufficiently wide to receive the other of the at least one peripheral walls that does not include the well.

17. The apparatus of claim 13, wherein the well is configured to prevent overflow of the adhesive from the well to the base of the first or second substrates.

18. The apparatus of claim 13, wherein the first portion is configured to contain a predetermined amount of adhesive, and wherein the second portion is configured to contain overflow of the adhesive within the well when the first and second substrates are mechanically anchored.

19. An apparatus, comprising:
first and second substrates, each of the first and second substrates comprising:
a base; and
at least one peripheral wall extending from the base, wherein one of the at least one peripheral walls of the first or second substrates includes at least one well defined within the at least one peripheral wall as a container so that adhesive does not leak from the at least one peripheral wall, and wherein the other of the at least one peripheral walls of the first or the second substrates that does not include a well is mechanically anchored to the well by the adhesive;
a stack having first and second ends, the stack disposed on the base of the first and/or the second substrates at the first and/or second ends, the stack comprising at least one element configured to generate thermal energy,
wherein the apparatus and another component that is connected with one of the first or second substrates are enclosed within a housing of a device, the component configured to receive thermal energy from the first or the second substrates.

20. The apparatus of claim 19, wherein the first and second substrates each include first and second surfaces, wherein the first substrate is in contact with the stack at the first surface, and wherein the second substrate comprises a protrusion that extends between the second surface of the second substrate and the stack.

21. An apparatus, comprising:
first and second substrates, each comprising
a base configured to support a stack; and
at least one peripheral wall extending from the base,
wherein one of the first or second substrates comprises a well defined within the at least one peripheral wall so that adhesive is contained within the well and does not leak outside of the at least one peripheral wall, and wherein the well comprises (1) a first portion that has a bottom surface that intersects a first plane parallel to the base, and (2) a second portion that has a bottom surface that intersects a second plane parallel to the base, where the first plane is closer to the base than the second plane, wherein the first and second substrates are mechanically anchored at the well by the adhesive, wherein the at least one peripheral wall of the first and second substrates laterally extend around the stack to form an enclosure, wherein the first portion is configured to contain a pre-determined amount of adhesive, and wherein the second portion is configured to contain overflow of the adhesive within the well when the first and second substrates are mechanically anchored.

22. The apparatus of claim 21, wherein the first portion horizontally intersects the first parallel plane, and wherein the second portion horizontally intersect the second parallel plane.

* * * * *